(12) United States Patent
McClain et al.

(10) Patent No.: US 6,731,536 B1
(45) Date of Patent: May 4, 2004

(54) PASSWORD AND DYNAMIC PROTECTION OF FLASH MEMORY DATA

(75) Inventors: Mark Alan McClain, San Diego, CA (US); Michael Garrett Tanaka, San Jose, CA (US); Ralf Muenster, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 121 days.

(21) Appl. No.: 10/091,767

(22) Filed: Mar. 7, 2002

Related U.S. Application Data

(60) Provisional application No. 60/273,615, filed on Mar. 5, 2001.

(51) Int. Cl.[7] .................................................. G11C 7/00
(52) U.S. Cl. ........................... 365/185.04; 365/185.29; 365/189.01; 365/218
(58) Field of Search ....................... 365/185.04, 185.29, 365/189.01, 218

(56) References Cited

U.S. PATENT DOCUMENTS

| | | | | |
|---|---|---|---|---|
| 5,794,033 A | * | 8/1998 | Aldebert et al. ............. | 713/100 |
| 5,930,826 A | * | 7/1999 | Lee et al. .................... | 711/163 |
| 6,031,757 A | * | 2/2000 | Chuang et al. ........ | 365/185.04 |
| 2002/0101763 A1 | * | 8/2002 | Hosogane et al. ..... | 365/185.22 |
| 2003/0126513 A1 | * | 7/2003 | Wuidart ....................... | 714/42 |

FOREIGN PATENT DOCUMENTS

| | | | | |
|---|---|---|---|---|
| JP | 410199270 A | * | 7/1998 | ........... G11C/16/02 |
| JP | 02001051889 A | * | 2/2001 | ........... G06F/12/00 |
| JP | 02002251310 A | * | 9/2002 | ........... G06F/12/00 |

* cited by examiner

*Primary Examiner*—Viet Q. Nguyen

(57) ABSTRACT

In protecting Flash memory data, a flexible system and method provides for different levels of protection. It offers the ability to dynamically lock a sector of memory using a dynamic protection bit in volatile memory. It offers persistent locking of a sector using a non-volatile bit in memory and locking this status using a lock bit in volatile memory. It offers yet further protection by including a password mode which requires a password to clear the lock bit. The password is located in an unreadable, one time programmable area of the memory. The memory also includes areas, whose protection state is controlled by an input signal, for storing boot code in a protected manner.

28 Claims, 1 Drawing Sheet

PASSWORD AND DYNAMIC PROTECTION OF FLASH MEMORY DATA

This application claims the benefit of U.S. Provisional application Ser. No. 60/273,615 filed Mar. 5, 2001.

FIELD OF THE INVENTION

This invention relates to a method and means for protecting Flash memory data.

BACKGROUND OF THE INVENTION

As virtually every sector of technology moves toward microprocessor controlled functionality, the need for effective protection of code controlling the microprocessor becomes increasingly important. Flash memory devices are common prey for hackers wishing to circumvent or control the code by making changes thereto or by replacing the Flash memory. Protection systems, therefore, have been devised to prevent the code from being erased or altered. Flash memory is also susceptible to damage caused by unintentional and intentional signals received by the memory. Some methods of protecting data stored in Flash memories are designed to prevent unintended changes due to electrical noise, or software program errors. These methods rely on electrical noise filters or complex sequences of software commands, that are an unlikely result of random or unintended electrical or software activity. Some protection methods even prevent intentional software controlled changes such as an attack by a virus program intended to damage stored data.

One commonly used method to prevent changes to the code on the Flash is to require a high voltage signal, e.g., 12 V to be applied to a pin on the Flash memory. Such a method assumes a lack of physical access to the flash device that would allow changing the electrical signals connected to the Flash memory. One or more signal inputs of the Flash are required to be at certain voltage levels in order to enable changes to the Flash data Without a physical change to the signal connections, the required voltage is not available. However, if physical access is possible, the appropriate voltage can be applied and any protection overridden. Furthermore, such hardware controlled methods of preventing unauthorized changes of information stored in a Flash memory have the drawback that there is no way to control, by means of software, the signal inputs of the Flash which enable changes to the data protection circuit. Furthermore, while this protection method provides protection against hackers who have no physical access to the chip, it does not help in situations where the unauthorized person has physical access to the chips. For example, in the automotive industry the motor vehicle speed regulator chips are physically available to the owner. Thus, performance control parameters can readily be altered, thereby exposing the vehicle, the vehicle engine, and the driver to speeds and forces not contemplated or intended by the motor vehicle manufacturer. Illegal car tuning is something that is a serious concern in the automotive industry. Tuners typically charge in the vicinity of $1,000 for modifications that cost them no more than $5.00 to implement. The damage that is caused by these illegal changes is, however, very high, resulting in anything from blown engines, destroyed gear boxes, to killed people.

The prior art approach has further drawbacks insofar as 12 V signals are often not available in a system. It, therefore, makes it difficult to perform authorized changes to the chip.

Another traditional method of indicating which portions or sectors of data within the Flash memory are to be protected, makes use of non-volatile memory bits. These may only be programmed and erased a limited number of times, typically 100 to a few hundred cycles. Thus, the protection state of sectors must remain fairly static, software cannot simply turn protection on and off on a frequent basis during system operation in order to have residual benefit of added protection from unintended changes along with ease of access when changes are needed.

Another traditional protection method is to use boot code that verifies an expected check sum of the data in the Flash in order to detect any illegal alterations of parameters. This software managed protection may require one or more password codes to be presented in order to change the Flash. However, since this protection is all implemented in software, and the algorithm is placed in the Flash, the code can be read. Thus, the algorithm and the passwords can be determined.

The present invention seeks to address some of the drawbacks in the prior art solutions.

SUMMARY OF THE INVENTION

The invention provides two levels of protection for each sector of data, a persistent level, and a dynamic level. The persistent level of protection uses traditional non-volatile control memory bits in conjunction with the optional requirement for a password in order to change the state of the persistent protection bits. The dynamic level, on the other hand, is implemented with logic flip-flops that define register bits, which can be changed an unlimited number of times. This allows the software to turn on and off data protection as frequently as desired for those sectors that do not require persistent non-volatile protection.

According to the invention, there is provided a method of protecting Flash memory against alterations, comprising providing different degrees of protection including persistently locking a sector for preventing modification of the sector, and dynamically locking a sector which prevents modification of the sector without first resetting a protection bit.

A sector may also be left in an unlocked state, which allows the contents to be changed at will.

In order to persistently lock a sector, a persistent protection bit (PPB) is assigned in non-volatile.

In order to dynamically lock a sector, a dynamic protection bit (DPB) is assigned in a volatile memory. This volatile memory may take the form of flip-flops. Thus, the DPBs are individually modifiable through a write command. Also, after a power-up or a hardware reset all DPBs arc reset.

A further level of protection can be applied to the persistent locking of the sectors, by making use of a PPB lock bit in volatile memory, which, when set, prevents the states of the PPBs being changed. Thus, changing the PPBs can only be achieved once the PPB lock bit is cleared.

Another level of protection can be achieved by holding a write protect pin low. This prevents certain sectors, e.g., the two outermost 8 kbyte sectors being changed. Thus, by maintaining boot code in these outermost sectors and holding the write protect (WP) pin low, boot code cannot be modified to interfere with the persistent sector protection settings defined at system initialization.

Yet a further level of protection is provided by including a password mode, requiring that a password, e.g., a 64-bit password, be entered in order to clear the PPB lock bit. The password may be fixed or may change from time to time. For example, a cyclic redundancy check (CRC), pseudo random number generator, or hamming code could be adopted to define a dynamic password algorithm to produce the next valid password. When password mode is selected, the PPB lock bit is preferably in the active state when the device is first powered on or comes out of a reset cycle so that the persistent protection bits may only be changed after a valid password is provided. If the password is fixed, it is stored in a one time programmable or permanently lockable region of the Flash memory.

In order to select password mode, a password mode locking bit is assigned which permanently sets the Flash memory in password mode. Similarly a non-password mode locking bit is assigned which, once set, permanently prevents password mode being entered. Typically, both mode locking bits are in a cleared state, ready for setting by the OEM or end-user when the device is shipped from the manufacturer.

Once the password mode is locked the ability to change or read the password is disabled. In order to obstruct attempts at deriving the password by writing a program to sequentially try every permutation of the password, a time delay may be introduced, e.g., 2 microseconds between each attempt to clear the PPB lock bit. Instead, only a limited number of successive PPB lock bit clear commands may be permitted. Yet another alternative is to require a new power cycle between each PPB lock bit clear command.

Preferably the password is related to an electronic serial number (ESN) stored in the flash device, since the password is unreadable after the password mode is enabled. The ESN makes it possible to identify the specific memory device and retrieve its password from a database when the password is needed.

Further, according to the invention, there is provided a Flash memory having multiple degrees of protection, comprising a non-volatile storage area defining at least one persistent protection bit (PPB) which has to be cleared in order to change the contents of the memory, and a volatile storage area defining at least one dynamic protection bit (DPB), which has to be cleared in order to change the contents of the memory.

The volatile storage area further defines at least one PPB lock bit which, when set prevents the at least one PPB from being cleared. Typically each PPB lock bit can be cleared only by means of a power-up reset or provision of a password.

Preferably there is one PPB and one DPB per sector of the Flash memory, and one or more PPB lock bits each related to one or more sectors. If there are multiple PPB lock bits, each may be cleard by a different password.

Preferably the Flash memory includes a password or password generating mechanism in the non-volatile storage area in an area that is read and write protected. Preferably the Flash includes at least one mode selection bit for selecting password mode or non-password mode. The at least one mode selection bit is preferably located in a one time programmable portion of memory to permanently lock the memory into one or the other mode.

The Flash memory may further include a write protect pin to prevent programing or erasing of part of the Flash memory. The pin may be further protected by putting it under potting material. Alternatively, the boot sectors can be preprogrammed at the wafer level and the write protect pin not bonded out. In yet another alternative, the write protect could have an internal pull down and have the write protect pin not routed or not routed to an obvious place.

DETAILED DESCRIPTION OF THE INVENTION

Figure 1:
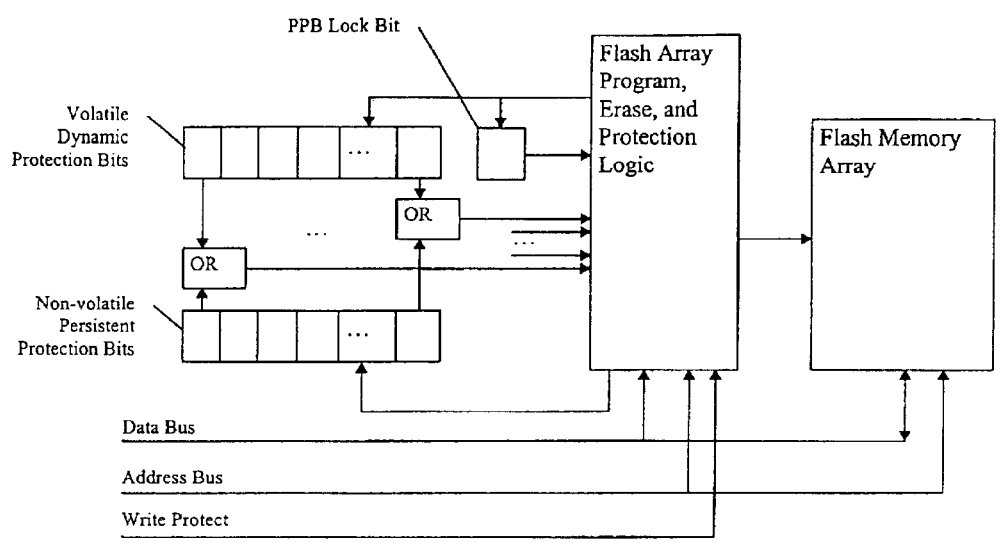
FIG. 1 is a block diagram of a Flash memory of the invention.

A Flash memory device is shown in FIG. 1, and includes a non-volatile memory region 10 and a volatile memory region 12. The bulk of the storage area in flash is non-volatile in nature, however, the present invention defines certain protection bits that may be volatile or non-volatile in nature and serve to prevent the contents of the flash being changed. For greater versatility, the present invention defines varying degrees of protection based on four considerations:

A. Whether the protection bit is defined in volatile or non-volatile memory;

B. Whether the protection bit itself may be prevented from changing state based on the state of a lock bit;

C. Whether a password is required to unlock the lock bit, and

D. Whether an external signal input is used to prevent changes being made to some sectors, independent of all other protection methods.

If the protection bit is defined in volatile memory, referred to as a Dynamic Protection Bit (DPB), it can be changed at will using software, and thus defines either a dynamic locked or unlocked state. In a preferred embodiment, one DPB is defined for each sector of the Flash memory. If the protection bit is in the non-volatile memory, referred to as a Persistent Protection Bit (PPB), it defines a persistently locked state when set. In a preferred embodiment, one PPB is defined for each sector. In a preferred embodiment, a PPB lock bit is provided in volatile memory to prevent PPBs from being altered. In one embodiment, only a single PPB lock bit is provided for the Flash memory, to lock or unlock all of the PPBs. It will, however, be appreciated that more than one PPB lock bit can be provided, e.g., one for each PPB.

The protection state for each sector is determined by the logical OR of the PPB and DPB related to that sector. Thus, for the sectors that have the PPBs cleared, the DPBs control whether or not the sector is protected or unprotected. By issuing a DPB write command sequence, the DPBs will be set or cleared, thus placing the corresponding sector in the protected or unprotected state. These may be referred to as dynamic locked or unlocked states, since it is easy to switch back and forth between the protected and unprotected conditions. This allows software to easily protect sectors against inadvertent changes, yet does not prevent the easy removal of protection when changes are needed. Since the DPBs are located in volatile memory, they may be set or cleared as often as is needed.

The PPBs allow for a more static, and difficult to change, level of protection. The PPBs retain their state across power cycles since they are implemented in non-volatile memory. Thus, while individual PPBs may be set with a command, they must all be cleared as a group through a complex sequence of programs and erasing commands. Also, the PPBs are limited to approximately 100 erase cycles, due to the non-volatile nature of the bits.

The PPB lock bit, which is implemented in volatile memory, adds an additional level of protection. Once all PPBs are programmed to the desired setting, the PPB lock bit may be set to 1. Setting the PPB lock bit disables all program and erase commands to the non-volatile PPBs. In effect, the PPB lock bit locks the PPBs into their current state. The only way to clear the PPB lock is to go through a power cycle. System boot code can determine if any changes to the PPBs are needed, e.g., to allow a new system code to be downloaded. If no changes are needed, the boot code can set the PPB lock to disable any further changes to the PPBs during system operation.

The write protect pin (WP#) adds a further level of hardware protection to the outermost 8 kbyte sectors. When this pin is low, it is not possible to change the contents of these two sectors. The sectors generally hold system boot code which includes the protection settings chosen for the Flash memory. Thus, the write protect pin can prevent any changes to the boot code that could override the choices made while setting up sector protection during system initialization.

It is possible to have sectors that have been persistently locked, and sectors that are left in the dynamic state. The sectors in the dynamic state are initially all unprotected. If there is a need to protect some of them, a simple DPB write command sequence is all that is necessary. The DPB write command for the dynamic sectors switches the DPBs to signify protected or unprotected state. In contrast, if there is a need to change the status of the persistently locked sectors, a few more steps are required. First, the PPB lock bit must be disabled which, in this embodiment, is done by either putting the device through a power cycle or hardware reset. In another embodiment, this can also be achieved using a software reset. As discussed below, the PPBs can then be changed to reflect the designed settings. Setting the PPB lock bit once again will lock the PPBs, and the device operates normally again.

Table A is a table containing all possible combinations of the DPBs, PPBs, and PPB lock bit relating to the status of a sector. The protection state of a particular sector is the logical OR of the related DPBs and PPBs. If the PPB is set, and the PPB lock is set, the sector is protected and the protection cannot be removed until the next power cycle clears the PPB lock bit. If the PPB is cleared, the sector can be dynamically locked or unlocked. The DPB then controls whether or not the sector is protected or unprotected.

TABLE A

| DPB | PPB | PPB Lock | Sector State |
|---|---|---|---|
| 0 | 0 | 0 | Unprotected PPB and DPB are changeable |
| 1 | 0 | 0 | Protected - PPB and DPB are changeable |
| 0 | 1 | 0 | Protected - PPB and DPB are changeable |
| 1 | 1 | 0 | Protected - PPB and DPB are changeable |
| 0 | 0 | 1 | Unprotected - PPB not changeable, DPB is changeable |
| 1 | 0 | 1 | Protected - PPB not changeable, DPB is changeable |
| 0 | 1 | 1 | Protected - PPB not changeable, DPB is changeable |
| 1 | 1 | 1 | Protected - PPB not changeable, DPB is changeable |

In a preferred embodiment, the Flash memory includes a non-password protection mode and a password protection mode. The former simply makes use of the DPBs, PPBs and one or more PPB lock bits to define the unlocked, dynamically locked or persistently locked states. When the device is first powered on, prior to any PPBs being set, the DPBs power up in a predetermined state, either set or cleared, such that all sectors are either protected or unprotected by the DPBs following the application of power or system reset. Unlike prior art protection solutions, non-password protection mode requires no unusual voltage levels and is therefore also referred to herein as Advanced Vcc-level protection mode.

The password protection mode allows a higher level of security than the advanced Vcc-level protection mode. It provides two added features, namely, when the device is first powered on or comes out of a reset cycle, the PPB lock bit is set to the locked state, rather than being cleared to the unlocked state, and furthermore, the only means of clearing the PPB lock bit is by writing a unique 64-bit password to the device. Otherwise, the password protection mode is identical to the non-password protection mode. The password is stored in a 1-time programmable region of the Flash memory. The password is used to clear the PPB lock bit. The password unlock command must be written to the Flash, along with a password. The Flash device internally compares the given password with the pre-programmed password. If they match, the PPB lock bit is cleared, and the PPBs can be altered. If they do not match, the Flash device does nothing. It will be appreciated that the password could instead be tied to erasing or writing to the PPB's, instead of to the clearing of the PPB lock bit. There is a built-in 2 to 4 $\mu$s delay for each password check. This delay is intended to thwart any efforts to run a program that tries all possible combinations in order to crack the password. Once a password mode locking bit is set, the password is permanently set with no means to read, program or erase it.

In order to define which mode the Flash memory is to be operated in, a non-password protection mode locking bit and a password mode locking bit are defined in one-time programmable memory.

These bits permanently set the protection mode, thereby ensuring that the protection mode can no longer be changed. This guarantees that a malitious programmer can not later put the device into the alternative protection mode.

In order to select the password protection scheme, the customer must first program the password. The password is located in its own memory space and is accessible through the use of password program and verifying commands. A customer may perform password verification operations after programming the password. Once the desired password is programmed, the customer must set the password mode locking bit to permanently set the device into password protection mode and to disable all further commands to the password region. All program and read operations to the password region are thereafter ignored. Accordingly, there is no means of verifying the password once the password mode locking bit has been set. Preferably the password is somehow correlated to an electronic serial number (ESN) stored in the particular flash device. The ESN may be different for every Flash device. The ESN provides a means to identify which password should be used with a particular memory device after the password is made unreadable by entering the password protection mode. The password mode locking bit is not erasable and has the effect of disabling the non-password protection mode.

Instead of a fixed password, another embodiment uses the first programmed password as the initial value (seed) of a dynamic password that changes after each use according to some algorithm. It will be appreciated by those skilled in the art, that any one of a number of approaches can be adopted including a Linear Feedback Shift Register (LFSR), Cyclic Redundancy Check (CRC) generator, pseudo random number generator, or hamming code. Each time the password is used, it is logged into a particular area of memory. The internal password algorithm then reads the logged password and runs it through the dynamic password algorithm to produce the next valid password. In a preferred embodiment, the password algorithm has a seed value that can set a different starting point in the password generating algorithm for each memory. The seed value can also be a hidden number thereby providing the triple protection of a hidden starting point, an undisclosed algorithm, and a dynamic password. In one embodiment, an LFSR (simply some shift registers and exclusive OR feedback gates to the input of the shift registers) is loaded with the initial password. The randomizing element involves a combination of selecting which feedback gates are used, and the number of shifts to take place to produce the dynamic password.

In order to avoid the password being found by writing a simple program to check all permutations of the password, a preferred embodiment disables password checking, after one password is supplied, until a power cycle has been completed, thereby requiring a power cycle each time a password check is made.

In another embodiment, each password check would require a significant time delay before an additional password check would be allowed. The delay would make trying all password combination take so long that it would not be a viable means to discover the password.

Typically, the Flash device is programmed by the system manufacturer or end user. The device initially operates in the non-password mode. The system manufacturer then may set the non-password protection mode locking bit, thereby disabling the password protection mode. Or, the system manufacturer may program the password and set the password mode locking bit, thereby disabling the non-password protection mode.

A preferred embodiment of the invention, further includes a hardware protection method. This involves the setting of a write protect pin which has the effect of protecting certain sectors, typically the sectors containing boot code. Even if the write protect pin is cleared, this does not circumvent the non-password or password protection features.

What is claimed is:

1. A method of protecting Flash memory against alterations, comprising
providing different degrees of protection including
persistently locking a sector for preventing modification of the sector, and
dynamically locking a sector which prevents modification of the sector without first resetting a protection bit.

2. A method of claim 1, wherein persistently locking a sector, includes assigning a persistent protection bit (PPB) in non-volatile memory.

3. A method of claim 1, wherein dynamically locking a sector, includes assigning a dynamic protection bit (DPB) in a volatile memory. This volatile memory may take the form of flip-flops.

4. A method of claim 3, wherein the DPBs are individually modifiable through a write command.

5. A method of claim 3, wherein after a power-up or a hardware reset all DPBs are either set or reset, depending on the desired default state.

6. A method of claim 2, further comprising a further level of protection applying to the persistent locking of the sectors, by making use of a PPB lock bit in volatile memory, which, when set, prevents the states of the PPBs being changed.

7. A method of claim 1, further comprising holding a write protect pin low to prevent certain sectors being changed.

8. A method of claim 7, further comprising maintaining boot code in said certain sectors.

9. A method of claim 6, further comprising including a password mode requiring that a password be entered in order to clear the PPB lock bit.

10. A method of claim 9, wherein the password is a fixed password.

11. A method of claim 9, wherein the password is variable and is produced by a dynamic password algorithm.

12. A method of claim 9, wherein when password mode is selected, the PPB lock bit is in a set state when the device is first powered on or comes out of a reset cycle.

13. A method of claim 10, wherein the password is stored in a one time programmable region of the Flash memory.

14. A method of claim 9, wherein a password mode locking bit is assigned which permanently sets the Flash memory in password mode.

15. A method of claim 9, wherein a non-password mode locking bit is assigned which, once set, permanently prevents entering the password mode.

16. A method of claim 9, wherein a time delay is introduced between each attempt to clear the PPB lock bit.

17. A method of claim 9, wherein only a limited number of successive attempts at clearing the PPB lock bit are permitted.

18. A method of claim 9, wherein a new power cycle is required between attempts to clear the PPB lock bit.

19. A method of claim 9, wherein the password is related to an electronic serial number (ESN) of the Flash memory.

20. A Flash memory having multiple degrees of protection, comprising
a non-volatile storage area defining at least one Persistent Protection Bit (PPB) which has to be cleared in order to change the contents of the memory, and
a volatile storage area defining at least one Dynamic Protection Bit (DPB), which has to be cleared in order to change the contents of the memory.

21. A method of claim 20, wherein the volatile storage area further defines at least one PPB lock bit which, when set prevents the at least one PPB from being cleared.

22. A method of claim 21, wherein each DPB and each PPB lock bit can be cleared only by means of a power-up or hardware reset.

23. A method of claim 21, wherein there is one PPB and one DPB per sector of the Flash memory, and a single global PPB lock bit for all sectors.

24. A Flash memory includes a password or password generating code in the non-volatile storage area in an area that is read and write protected.

25. A method of claim 24, wherein the password in the non-volatile storage area or generated by the code defines a password that has to be entered to clear the PPB lock bit.

26. A method of claim 25, wherein the Flash memory includes at least one mode selection bit for selecting password mode or non-password mode.

27. A method of claim 26, wherein the at least one mode selection bit is located in a one time programmable portion of the memory to permanently lock the memory into one or the other-mode.

28. A method of claim 20, wherein further including a write protect pin to prevent programming or erasing of part of the Flash memory.

* * * * *